(12) United States Patent
Park

(10) Patent No.: US 11,315,905 B2
(45) Date of Patent: Apr. 26, 2022

(54) SEMICONDUCTOR PACKAGES INCLUDING A BONDING WIRE BRANCH STRUCTURE

(71) Applicant: SK hynix Inc., Icheon-si (KR)

(72) Inventor: Chul Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/910,821

(22) Filed: Jun. 24, 2020

(65) Prior Publication Data
US 2021/0217731 A1 Jul. 15, 2021

(30) Foreign Application Priority Data
Jan. 10, 2020 (KR) .......................... 10-2020-0003928

(51) Int. Cl.
*H01L 25/065* (2006.01)
*H01L 23/00* (2006.01)
*H01L 23/528* (2006.01)

(52) U.S. Cl.
CPC ...... *H01L 25/0657* (2013.01); *H01L 23/5286* (2013.01); *H01L 24/45* (2013.01); *H01L 2225/06506* (2013.01); *H01L 2924/3025* (2013.01)

(58) Field of Classification Search
None
See application file for complete search history.

(56) References Cited

U.S. PATENT DOCUMENTS

| 10,157,883 | B2 | 12/2018 | Park et al. | |
|---|---|---|---|---|
| 2007/0035002 | A1* | 2/2007 | Moto | H01L 24/743 257/686 |
| 2009/0108470 | A1* | 4/2009 | Okada | H01L 29/0657 257/777 |
| 2009/0273096 | A1* | 11/2009 | Hiew | H01L 23/3121 257/777 |
| 2011/0037158 | A1* | 2/2011 | Youn | H01L 24/73 257/686 |
| 2012/0080806 | A1* | 4/2012 | Song | H01L 25/0657 257/777 |
| 2013/0049228 | A1* | 2/2013 | Nam | H01L 25/50 257/777 |

(Continued)

FOREIGN PATENT DOCUMENTS

KR 1020180044515 A 5/2018

*Primary Examiner* — Zandra V Smith
*Assistant Examiner* — Lawrence C Tynes, Jr.
(74) *Attorney, Agent, or Firm* — William Park & Associates Ltd.

(57) ABSTRACT

A semiconductor package includes a package substrate, a die stack having a first sub-stack part and a second sub-stack part, an interface chip, and a bonding wire structure. The bonding wire structure includes a first signal wire connecting first signal die pads included in the first sub-stack part to each other, a first signal extension wire connecting the first signal wire to the interface chip, a second signal wire connecting second signal die pads included in the first sub-stack part to each other, a second signal extension wire connecting the second signal wire to the interface chip, an interpose wire connecting interpose die pads included in the first and second sub-stack parts to each other and electrically connecting the interpose die pads to the interface chip, and a shielding wire branched from the interpose wire.

21 Claims, 10 Drawing Sheets

(56) References Cited

U.S. PATENT DOCUMENTS

| | | | |
|---|---|---|---|
| 2013/0168842 A1* | 7/2013 | Park | H01L 23/4951 257/690 |
| 2015/0108663 A1* | 4/2015 | Hong | H01L 25/18 257/777 |
| 2015/0171020 A1* | 6/2015 | Shibuya | H01L 25/105 257/659 |
| 2017/0243858 A1* | 8/2017 | Chou | H01L 23/49827 |

* cited by examiner

SEMICONDUCTOR PACKAGES INCLUDING A BONDING WIRE BRANCH STRUCTURE

CROSS-REFERENCE TO RELATED APPLICATIONS

The present application claims priority under 35 U.S.C. 119(a) to Korean Application No. 10-2020-0003928, filed on Jan. 10, 2020, which is incorporated herein by references in its entirety.

BACKGROUND

1. Technical Field

Embodiments of the present disclosure relate to semiconductor package technologies and, more particularly, to semiconductor packages including a bonding wire branch structure.

2. Related Art

Semiconductor packages having a large capacity and a high density are increasingly in demand with the development of high performance electronic systems. A lot of effort has been focused on embedding a plurality of semiconductor dies in one semiconductor package. That is, highly integrated semiconductor packages may be realized by increasing the number of semiconductor dies vertically stacked in each semiconductor package. Bonding wires are widely used to electrically connect the stacked semiconductor dies to each other or to electrically connect the stacked semiconductor dies to a package substrate. As the number of semiconductor dies vertically stacked in each semiconductor package increases, a length of the bonding wires may also become increased. Increasing the length of the bonding wires may lead to degradation of electrical characteristics of data signals transmitted through the bonding wires.

SUMMARY

According to an embodiment, a semiconductor package may include a package substrate, a die stack, and an interface chip. The die stack may include a first sub-stack part stacked on the package substrate and a second sub-stack part disposed between the first sub-stack part and the package substrate. Each of the first and second sub-stack parts may include a plurality of semiconductor dies, and each of the plurality of semiconductor dies may include a first signal die pad, an interpose die pad, and a second signal die pad. The interface chip is disposed on the package substrate to be spaced apart from the die stack. The first signal die pads included in the first sub-stack part are connected to each other by a first signal wire. A first signal extension wire extends from the first signal wire to connect the first signal wire to the interface chip. The second signal die pads included in the first sub-stack part are connected to each other by a second signal wire. A second signal extension wire extends from the second signal wire to connect the second signal wire to the interface chip. An interpose wire connects the interpose die pads included in the first and second sub-stack parts to each other and extends to electrically connects the interpose die pads included in the first and second sub-stack parts to the interface chip. A shielding wire is branched from the interpose wire and is located between the first and second signal extension wires.

According to another embodiment, a semiconductor package may include a package substrate, a die stack, and an interface chip. The die stack is configured to include a first sub-stack part stacked on the package substrate and a second sub-stack part disposed between the first sub-stack part and the package substrate. Each of the first and second sub-stack parts may include a plurality of semiconductor dies, and each of the plurality of semiconductor dies may include a first signal die pad, an interpose die pad, and a second signal die pad. The interface chip is disposed on the package substrate to be spaced apart from the die stack and is configured to include a first column of chip pads and a second column of chip pads. The first column of chip pads may include a first signal chip pad, a shielding chip pad, and a second signal chip pad, and the second column of chip pads may include a third signal chip pad, an interpose chip pad, and a fourth signal chip pad. The first signal die pads included in the first sub-stack part are connected to each other by a first signal wire. A first signal extension wire extends from the first signal wire to connect the first signal wire to the first signal chip pad. The second signal die pads included in the first sub-stack part are connected to each other by a second signal wire. A second signal extension wire extends from the second signal wire to connect the second signal wire to the second signal chip pad. The interpose die pads included in the first and second sub-stack parts are connected to each other by an interpose wire, and the interpose wire electrically connects the interpose die pads included in the first and second sub-stack parts to the interpose chip pad. The first signal die pads included in the second sub-stack part are connected to each other by a third signal wire, and the third signal wire extends to electrically connect the first signal die pads included in the second sub-stack part to the third signal chip pad. The second signal die pads included in the second sub-stack part are connected to each other by a fourth signal wire, and the fourth signal wire extends to electrically connect the second signal die pads included in the second sub-stack part to the fourth signal chip pad. A shielding wire is branched from the interpose wire and is located between the first and second signal extension wires.

According to yet another embodiment, a semiconductor package may include a package substrate, a die stack, and an interface chip. The die stack is configured to include semiconductor dies stacked on the package substrate. Each of the semiconductor dies may include a die pad. The interface chip is disposed on the package substrate to be spaced apart from the die stack and is configured to include a first chip pad and a second chip pad. The die pads of the semiconductor dies are connected to each other by a first bonding wire, and the first bonding wire extends to electrically connect the die pads to the first chip pad of the interface chip. A second bonding wire is branched from the first bonding wire and is connected to the second chip pad of the interface chip. The first bonding wire may include a first sub-wire and a second sub-wire. The first sub-wire may include a first ball portion which is bonded to the die pad located at a position where the second bonding wire is branched from the first bonding wire. The second sub-wire may include a stitch portion which is vertically bonded onto the first ball portion. The second bonding wire may include a second ball portion vertically bonded onto the stitch portion.

DETAILED DESCRIPTION

Figure 1:
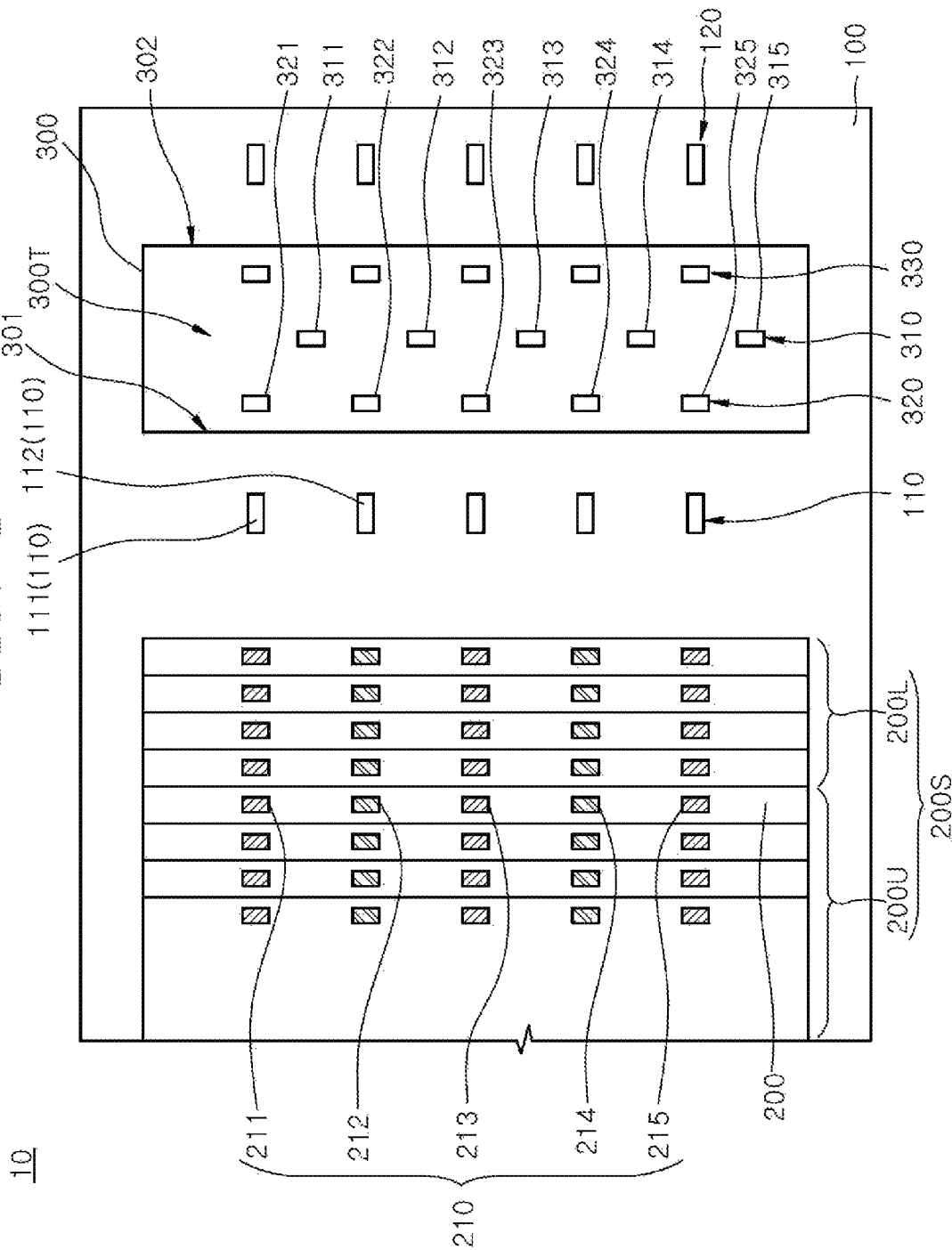
FIGS. 1 and 2 are a plan view and a cross-sectional view illustrating a semiconductor package according to an embodiment, respectively.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms "first," "second," "third" etc. may be used herein to describe various elements, these elements should not be limited by these terms. These terms are only used to distinguish one element from another element, but not used to define only the element itself or to mean a particular sequence.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

Spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly.

A semiconductor package may include electronic devices such as semiconductor chips or semiconductor dies. The semiconductor chips or the semiconductor dies may be obtained by separating a semiconductor substrate such as a wafer into a plurality of pieces using a die sawing process.

The semiconductor chips may correspond to memory chips, logic chips, or application specific integrated circuits (ASIC) chips. The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits or phase change random access memory (PcRAM) circuits which are integrated on the semiconductor substrate. The semiconductor package may be employed in communication systems such as mobile phones, electronic systems associated with biotechnology or health care, or wearable electronic systems. The semiconductor packages may be applicable to internet of things (IoT).

Same reference numerals refer to same elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to another drawing.

Figure 2:
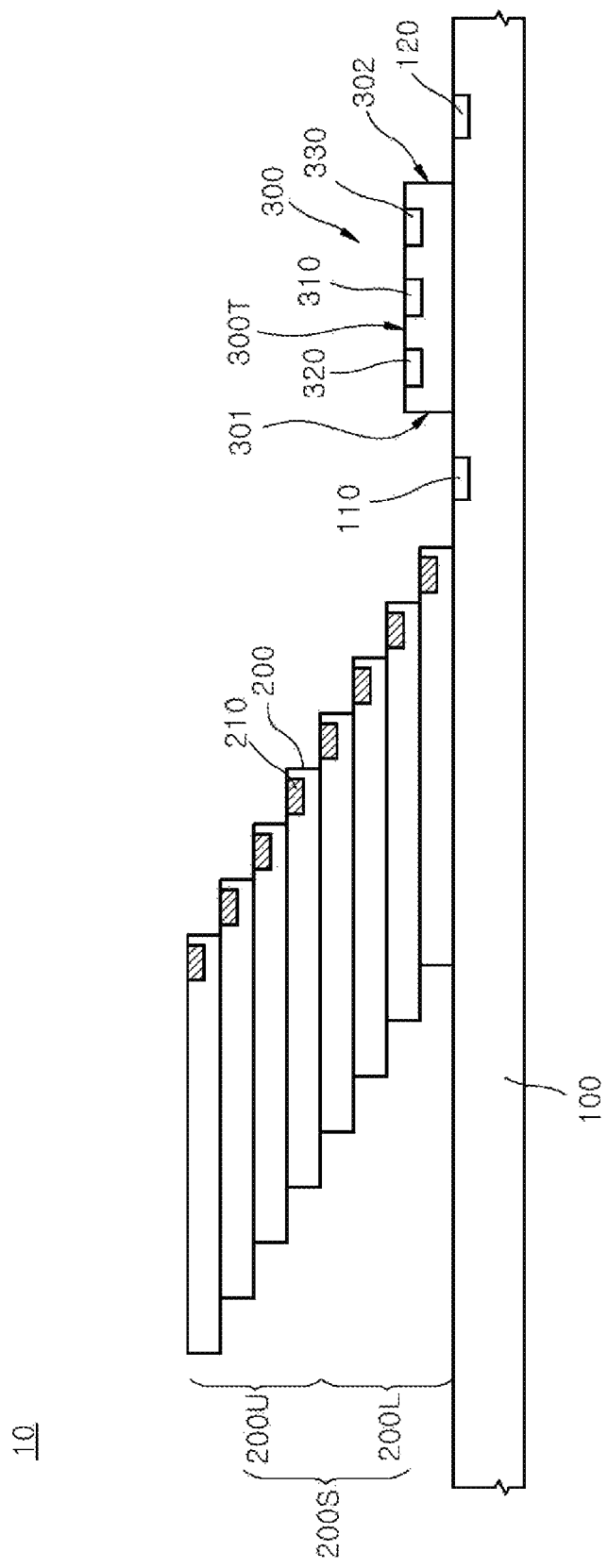

FIGS. 1 and 2 are a plan view and a cross-sectional view illustrating a semiconductor package 10 according to an embodiment, respectively.

Referring to FIGS. 1 and 2, the semiconductor package 10 may be configured to include a package substrate 100, a die stack 200S, and an interface chip 300. The package substrate 100 may be provided as a base member on which semiconductor dies 200 and the interface chip 300 are disposed. The package substrate 100 may be configured to include multiple layers of metallization and a plurality of dielectric layers. The package substrate 100 may be provided as a connection member for electrically connecting the semiconductor package 10 to an electronic system. The package substrate 100 may be realized using a printed circuit board (PCB).

The plurality of semiconductor dies 200 may be sequentially stacked on the package substrate 100 to constitute the die stack 200S. The die stack 200S may include a first sub-stack part 200U corresponding to an upper portion of the die stack 200S and a second sub-stack part 200L corresponding to a lower portion of the die stack 200S. For example, when the number of the semiconductor dies 200 constituting the die stack 200S is '8', four of the semiconductor dies 200 may constitute the first sub-stack part 200U and the other four dies of the semiconductor dies 200 may constitute the second sub-stack part 200L disposed under the first sub-stack part 200U.

The semiconductor dies 200 may have substantially the same configuration and function. Each of the semiconductor dies 200 may be a die including integrated circuits which are realized on a silicon substrate. Each of the semiconductor dies 200 may be a memory die, for example, a flash memory die.

The semiconductor dies 200 may be sequentially stacked to be offset in one direction to provide a step structure. Each of the semiconductor dies 200 may include a plurality of die pads 210 acting as connection terminals. The semiconductor dies 200 may be stacked to be laterally offset such that the die pads 210 of the semiconductor dies 200 are revealed. Bonding wires may be bonded to the revealed die pads 210.

In each of the semiconductor dies 200, the die pads 210 may include a first signal die pad 211, a first interpose die pad 212, a second signal die pad 213, a second interpose die pad 214, and a third signal die pad 215. The first signal die pad 211, the second signal die pad 213, and the third signal die pad 215 may be provided as signal terminals through which data signals are transmitted.

In an embodiment, the first interpose die pad 212 and the second interpose die pad 214 may be provided as power terminals for applying a power supply voltage to the semiconductor die 200. In another embodiment, the first interpose die pad 212 and the second interpose die pad 214 may be provided as ground terminals for supplying a ground voltage to the semiconductor die 200. Alternatively, the first interpose die pad 212 may be provided as a power terminal for applying a power supply voltage to the semiconductor die 200, and the second interpose die pad 214 may be provided as a ground terminal for supplying a ground voltage to the semiconductor die 200.

In each of the semiconductor dies 200, the die pads 210 may be sequentially arrayed in one column. In each of the semiconductor dies 200, the first signal die pad 211, the first interpose die pad 212, the second signal die pad 213, the second interpose die pad 214, and the third signal die pad 215 may be sequentially arrayed in one column. The first interpose die pad 212 may be disposed between the first signal die pad 211 and the second signal die pad 213. The second interpose die pad 214 may be disposed between the second signal die pad 213 and the third signal die pad 215.

The die pads 210 of the semiconductor dies 200 may be arrayed in a plurality of rows which are parallel with a direction in which the semiconductor dies 200 are offset when viewed from a plan view. For example, the first signal die pads 211 of the plurality of semiconductor dies 200 may be arrayed in a row in a plan view. Similarly, the first interpose die pads 212 of the plurality of semiconductor dies 200 may also be arrayed in a row in a plan view.

Referring again to FIGS. 1 and 2, the interface chip 300 may be disposed on the package substrate 100 to be laterally spaced apart from the die stack 200S. The interface chip 300 may include chip pads 310, 320, and 330 disposed on a top surface 300T thereof. The interface chip 300 may have a first edge 301 and a second edge 302, the top surface 300T may be set as a surface between the first edge 301 and the second edge 302. A distance between the first edge 301 and the die stack 200S may be less than a distance between the second edge 302 and the die stack 200S. The first edge 301 may face the die stack 200S, and the second edge 302 may be an edge of the interface chip 300 opposite to the die stack 200S.

The chip pads 310 may be arrayed in a first column on the top surface 300T of the interface chip 300, the chip pads 320 may be arrayed in a second column on the top surface 300T of the interface chip 300, and the chip pads 330 may be arrayed in a third column on the top surface 300T of the interface chip 300. The chip pads 310 arrayed in the first column may be disposed between the first edge 301 and the second edge 302. The chip pads 320 arrayed in the second column may be disposed between the first edge 301 and the first column in which the chip pads 310 are arrayed. The chip pads 330 arrayed in the third column may be disposed between the second edge 302 and the first column in which the chip pads 310 are arrayed. A distance between the first edge 301 and the second column in which the chip pads 320 are arrayed may be less than a distance between the first edge 301 and the first column in which the chip pads 310 are arrayed, and the chip pads 320 may be arrayed in a direction which is parallel with an extension direction of the first edge 301. A distance between the second edge 302 and the third column in which the chip pads 330 are arrayed may be less than a distance between the second edge 302 and the first column in which the chip pads 310 are arrayed, and the chip pads 330 may be arrayed in a direction which is parallel with an extension direction of the second edge 302.

The chip pads 310 arrayed in the first column may include a first signal chip pad 311, a first shielding chip pad 312, a second signal chip pad 313, a second shielding chip pad 314, and a fifth signal chip pad 315 which are sequentially arrayed in the first column. The first shielding chip pad 312 may be disposed between the first signal chip pad 311 and the second signal chip pad 313. The first signal chip pad 311 may be provided as a chip pad corresponding to the first signal die pads 211 of the semiconductor dies 200 included in the first sub-stack part 200U, and the first shielding chip pad 312 may be provided as a chip pad corresponding to the first interpose die pads 212 of the semiconductor dies 200 included in the first sub-stack part 200U. The second signal chip pad 313 may be provided as a chip pad corresponding to the second signal die pads 213 of the semiconductor dies 200 included in the first sub-stack part 200U, and the fifth signal chip pad 315 may be provided as a chip pad corresponding to the third signal die pads 215 of the semiconductor dies 200 included in the first sub-stack part 200U.

The chip pads 320 arrayed in the second column may include a third signal chip pad 321, a first interpose chip pad 322, a fourth signal chip pad 323, a second interpose chip pad 324, and a sixth signal chip pad 325 which are sequentially arrayed in the second column. The first interpose chip pad 322 may be disposed between the third signal chip pad 321 and the fourth signal chip pad 323. The third signal chip pad 321 may be provided as a chip pad corresponding to the first signal die pads 211 of the semiconductor dies 200 included in the second sub-stack part 200L, and the first interpose chip pad 322 may be provided as a chip pad corresponding to the first interpose die pads 212 of the semiconductor dies 200. The fourth signal chip pad 323 may be provided as a chip pad corresponding to the second signal die pads 213 of the semiconductor dies 200 included in the second sub-stack part 200L, and the sixth signal chip pad 325 may be provided as a chip pad corresponding to the third signal die pads 215 of the semiconductor dies 200 included in the second sub-stack part 200L. The second interpose chip pad 324 may be disposed between the fourth signal chip pad 323 and the sixth signal chip pad 325. The second interpose chip pad 324 may be provided as a chip pad corresponding to the second interpose die pads 214 of the semiconductor dies 200.

Referring still to FIGS. 1 and 2, the package substrate 100 may include first bond fingers 110 disposed between the die stack 200S and the interface chip 300. The first bond fingers 110 may be disposed to correspond to the die pads 210 of the semiconductor dies 200. A signal bond finger 111 of the first bond fingers 110 may be disposed to correspond to the first signal die pads 211 of the semiconductor dies 200, and an interpose bond finger 112 of the first bond fingers 110 may be disposed to be spaced apart from the signal bond finger 111. The package substrate 100 may further include second bond fingers 120 that are disposed to be adjacent to the second edge 302 of the interface chip 300. The interface chip 300 may be disposed between a column in which the first bond fingers 110 are arrayed and a column in which the second bond fingers 120 are arrayed.

Figure 3:
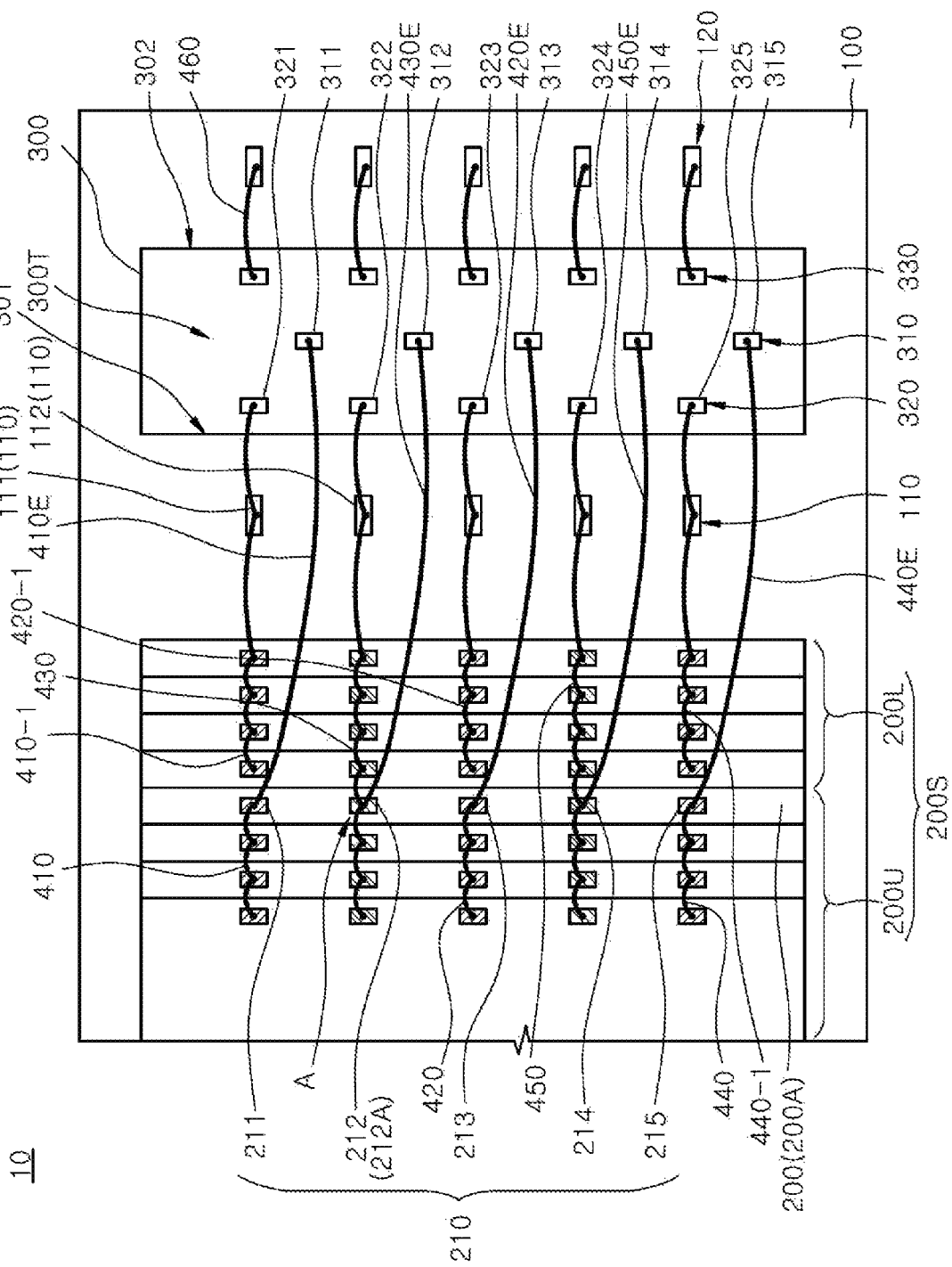
FIG. 3 is a plan view illustrating a bonding wire structure of the semiconductor package shown in FIG. 1.
Figure 4:
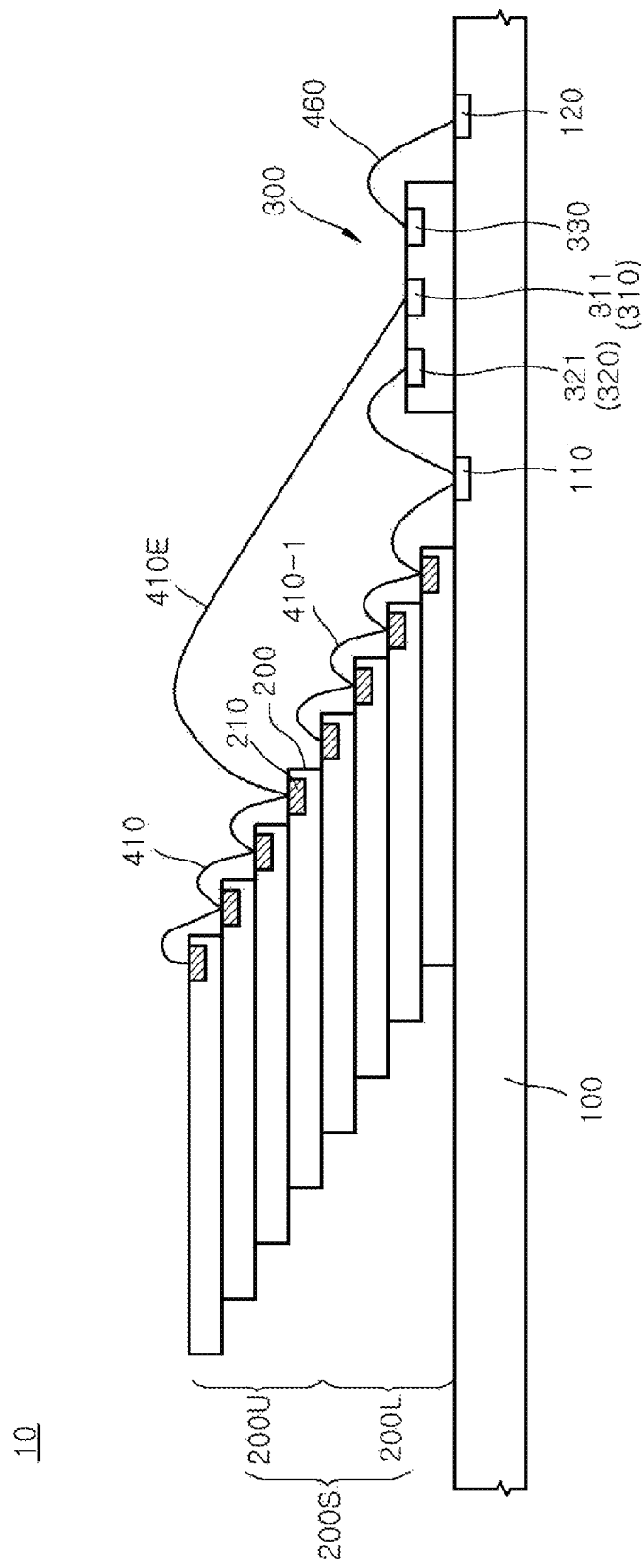
FIG. 4 is a cross-sectional view taken along an extension direction of signal extension wires shown in FIG. 3.
Figure 5:
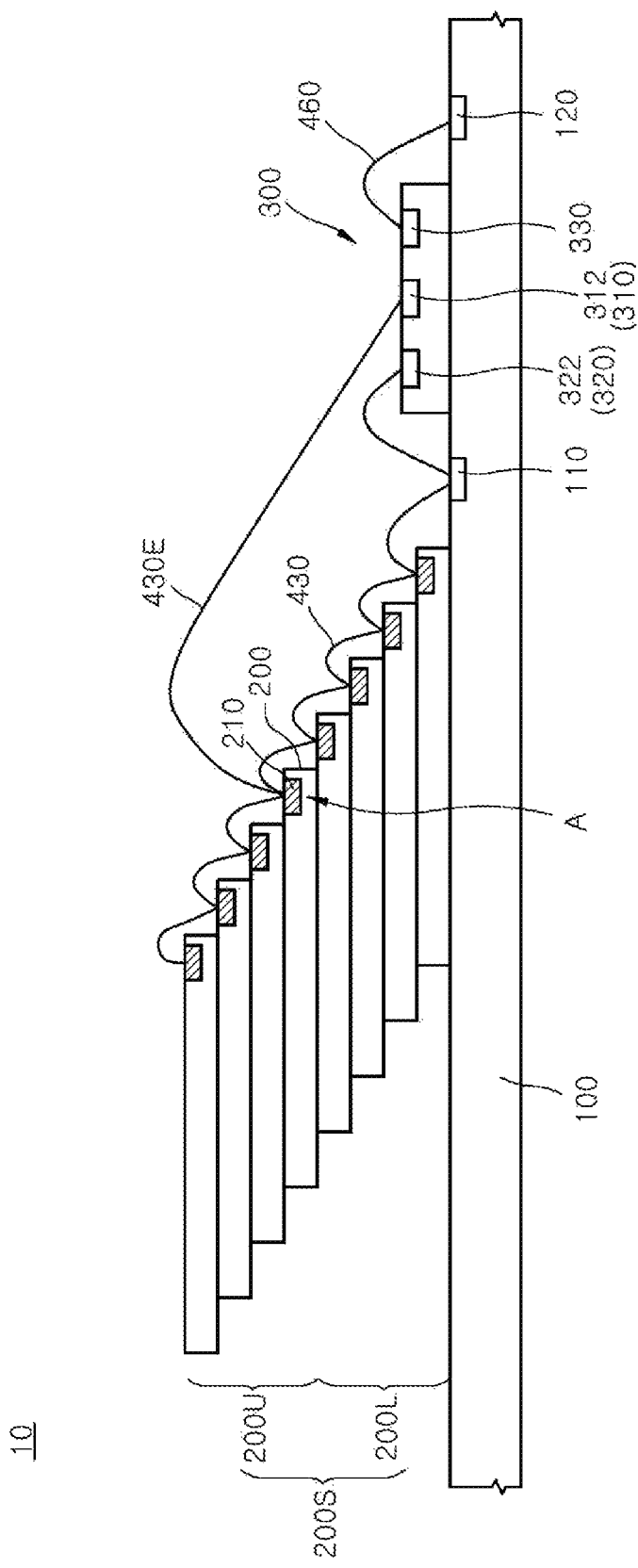
FIG. 5 is a cross-sectional view taken along an extension direction of shielding wires shown in FIG. 3.

FIG. 3 is a plan view illustrating a bonding wire structure of the semiconductor package 10 shown in FIG. 1. FIG. 4 is a cross-sectional view taken along an extension direction of a first signal extension wire 410E of the bonding wire structure shown in FIG. 3. FIG. 5 is a cross-sectional view taken along an extension direction of a first shielding wire 430E of the bonding wire structure shown in FIG. 3.

Referring to FIG. 3, the semiconductor package 10 may include a bonding wire structure for connecting the die stack 200S to the interface chip 300 and for connecting the interface chip 300 to the package substrate 100. The bonding wire structure may include a first signal wire 410, a first signal extension wire 410E, a second signal wire 420, a second signal extension wire 420E, a first interpose wire 430, a second interpose wire 450, the first shielding wire 430E, and a second shielding wire 450E. The bonding wire structure may further include a third signal wire 410-1, a fourth signal wire 420-1, a fifth signal wire 440, a fifth signal extension wire 440E, a sixth signal wire 440-1, and chip boding wires 460. This bonding wire structure may be formed using a wire bonding process.

Referring to FIGS. 3 and 4, the first signal wire 410 may be formed to connect the first signal die pads 211 included in the first sub-stack part 200U to each other. The first signal wire 410 may be formed to connect only the semiconductor dies 200 included in the first sub-stack part 200U to each other. The first signal wire 410 may be electrically disconnected from the semiconductor dies 200 included in the second sub-stack part 200L.

The first signal extension wire 410E may be formed to connect the first signal wire 410 to the interface chip 300. The first signal extension wire 410E may be formed to extend from the first signal wire 410 and may be bonded to the first signal chip pad 311 of the interface chip 300. The first signal extension wire 410E may be disconnected from the package substrate 100 and may extend to be spaced apart from the package substrate 100. The first signal extension wire 410E may extend to be directly connected to the interface chip 300 without being connected to the package substrate 100.

The third signal wire 410-1 may be formed to connect the first signal die pads 211 included in the second sub-stack part 200L to each other and may extend to electrically connect the first signal die pads 211 included in the second sub-stack part 200L to the third signal chip pad 321 of the interface chip 300. The third signal wire 410-1 may be bonded to the signal bond finger 111 and may further extend to connect the signal bond finger 111 to the interface chip 300. The third signal wire 410-1 may be connected to the interface chip 300 through the signal bond finger 111 of the package substrate 100.

The third signal wire 410-1 may be disconnected from the semiconductor dies 200 included in the first sub-stack part 200U and may connect only the semiconductor dies 200 included in the second sub-stack part 200L to the interface chip 300. The first signal wire 410 and the first signal extension wire 410E may be disconnected from the semiconductor dies 200 included in the second sub-stack part 200L and may electrically connect only the semiconductor dies 200 included in the first sub-stack part 200U to the first signal chip pad 311 of the interface chip 300. The third signal wire 410-1 may provide a second signal path that is independent and distinct from a first signal path comprised of the first signal wire 410 and the first signal extension wire 410E.

Through the first and second signal paths which are independent from each other, the first sub-stack part 200U and the second sub-stack part 200L may independently communicate with the interface chip 300. The interface chip 300 may individually control the first sub-stack part 200U and the second sub-stack part 200L through the first and second signal paths. The interface chip 300 may control the first sub-stack part 200U and the second sub-stack part 200L separately without simultaneously controlling all of the eight semiconductor dies 200 included in the die stack 200S. Thus, a first group of the semiconductor dies 200 included in the first sub-stack part 200U and a second group of the semiconductor dies 200 included in the second sub-stack part 200L may independently operate to improve an operation speed of the semiconductor package 10. The interface chip 300 may be a control chip for controlling the semiconductor dies 200 included in the die stack 200S or a buffer chip for buffering operations of the semiconductor dies 200 included in the die stack 200S.

Referring again FIG. 3, the second signal wire 420 may be formed to connect the second signal die pads 213 included in the first sub-stack part 200U to each other. The second signal wire 420 may be formed to connect only the semiconductor dies 200 included in the first sub-stack part 200U to each other.

The second signal extension wire 420E may be formed to connect the second signal wire 420 to the interface chip 300. The second signal extension wire 420E may be formed to extend from the second signal wire 420 and may be bonded to the second signal chip pad 313 of the interface chip 300. The second signal extension wire 420E may be disconnected from the package substrate 100 and may extend to be spaced apart from the package substrate 100. The second signal extension wire 420E may extend to be directly connected to the interface chip 300 without being connected to the package substrate 100.

The fourth signal wire 420-1 may be formed to connect the second signal die pads 213 included in the second sub-stack part 200L to each other and may extend to electrically connect the second signal die pads 213 included in the second sub-stack part 200L to the fourth signal chip pad 323 of the interface chip 300. The fourth signal wire 420-1 may be bonded to one of the first bond fingers 110 and may further extend to connect the one of the first bond fingers 110 to the interface chip 300. The fourth signal wire 420-1 may be connected to the interface chip 300 through one of the first bond fingers 110 of the package substrate 100.

Referring again to FIG. 3, the fifth signal wire 440 may be formed to connect the third signal die pads 215 included in the first sub-stack part 200U to each other. The fifth signal extension wire 440E may be formed to extend from the fifth signal wire 440 and may be bonded to the fifth signal chip pad 315 of the interface chip 300. The fifth signal extension wire 440E may extend to be parallel with the first and second signal extension wires 410E and 420E. The sixth signal wire 440-1 may be formed to connect the third signal die pads 215 included in the second sub-stack part 200L to each other and may extend to electrically connect the third signal die pads 215 included in the second sub-stack part 200L to the sixth signal chip pad 325 of the interface chip 300.

Referring to FIGS. 3 and 5, the first interpose wire 430 may connect the first interpose die pads 212 included in the first and second sub-stack parts 200U and 200L to each other and may further extend to electrically connect the first interpose die pads 212 included in the first and second sub-stack parts 200U and 200L to the first interpose chip pad 322 of the interface chip 300. The first interpose wire 430 may be bonded to the interpose bond finger 112 of the package substrate 100 and may further extend to connect the interpose bond finger 112 to the first interpose chip pad 322 of the interface chip 300. The first interpose wire 430 may be connected to the interface chip 300 through one of the interpose bond finger 112 of the package substrate 100.

The first interpose wire 430 may be used as a power supply wire for supplying a power supply voltage to the semiconductor dies 200 included in the first and second sub-stack parts 200U and 200L. Alternatively, the first interpose wire 430 may be used as a ground wire for supplying a ground voltage to the semiconductor dies 200 included in the first and second sub-stack parts 200U and 200L.

The first shielding wire 430E may be branched from the first interpose wire 430 at the branch position 'A'. The first shielding wire 430E may be branched from the first interpose wire 430 and may extend to be connected to the first shielding chip pad 312 of the interface chip 300. The first shielding wire 430E may extend to be located between the first and second signal extension wires 410E and 420E. The first shielding wire 430E may be formed to extend in a direction which is substantially parallel with the first and second signal extension wires 410E and 420E. In an embodiment, the first shielding wire 430E may be formed to extend in a direction between the first and second signal extension wires 410E and 420E to mitigate electromagnetic interference between the first and second signal extension wires 410E and 420E. In an embodiment, the first shielding wire 430E may be configured to extend in a direction between the first and second signal extension wires 410E and 420E to shield electromagnetic interference between the first and second signal extension wires 410E and 420E. In an embodiment, the first shielding wire 430E may be formed to extend in a direction between the first and second signal extension wires 410E and 420E and along a same profile as at least one of the first and second signal extension wires 410E and 420E. The first shielding wire 430E may be disconnected from the package substrate 100 and may extend to be spaced apart from the package substrate 100. The first shielding wire 430E may extend to be directly connected to the interface chip 300 without being connected to the package substrate 100.

Referring again to FIG. 3, the second interpose wire 450 may connect the second interpose die pads 214 included in the first and second sub-stack parts 200U and 200L to each other and may further extend to electrically connect the second interpose die pads 214 included in the first and second sub-stack parts 200U and 200L to the second interpose chip pad 324 of the interface chip 300. The second interpose wire 450 may be used as another power supply wire for supplying a power supply voltage to the semiconductor dies 200 included in the first and second sub-stack parts 200U and 200L. Alternatively, the second interpose wire 450 may be used as another ground wire for supplying a ground voltage to the semiconductor dies 200 included in the first and second sub-stack parts 200U and 200L. In some embodiments, the second interpose wire 450 may be used as a ground wire, and the first interpose wire 430 may be used as a power supply wire.

The second shielding wire 450E may be branched from the second interpose wire 450 and may extend to be connected to the second shielding chip pad 314 of the interface chip 300. The second shielding wire 450E may extend to be located between the second signal extension wire 420E and the fifth signal extension wire 440E. The second shielding wire 450E may be formed to extend in a direction which is substantially parallel with the second signal extension wire 420E and the fifth signal extension wire 440E.

Figure 6:
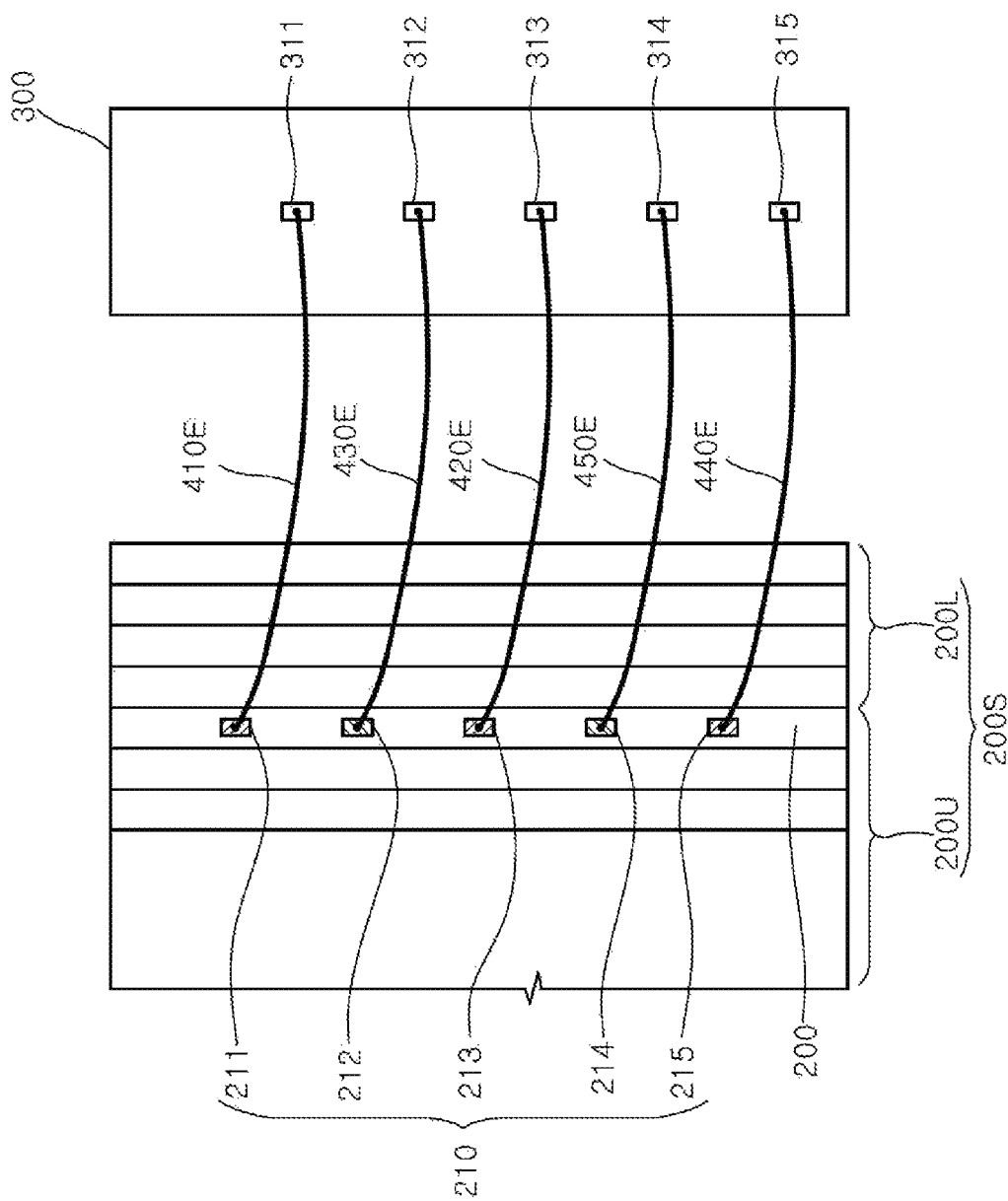
FIG. 6 is a plan view illustrating shielding wires of FIG. 3.

FIG. 6 is a plan view illustrating the signal extension wires 410E, 420E, and 440E and the shielding wires 430E and 450E included in the bonding wire structure of FIG. 3. Some elements less related to the disposal of the signal extension wires 410E, 420E, and 440E and the shielding wires 430E and 450E will be omitted in FIG. 6 for the purpose of ease and convenience in explanation.

Referring to FIGS. 3 and 6, the first shielding wire 430E may be disposed between the first and second signal extension wires 410E and 420E, and the second shielding wire 450E may be disposed between the second signal extension wire 420E and the fifth signal extension wire 440E. The first shielding wire 430E may act as a shielding member for shielding electromagnetic interference between the first and second signal extension wires 410E and 420E. The first shielding wire 430E may suppress or reduce signal noises between the first and second signal extension wires 410E and 420E. When signals are transmitted between the first sub-stack part 200U and the interface chip 300, the first shielding wire 430E may provide a solution for reducing the signal noises.

The second shielding wire 450E may act as a shielding member for shielding electromagnetic interference between the second and fifth signal extension wires 420E and 440E.

Referring again to FIG. 3, the interface chip 300 may include the first column of chip pads 310 and the second column of chip pads 320 which are electrically connected to the die stack 200S and may further include the third column of chip pads 330. The chip boding wires 460 may be bonded to connect the third column of chip pads 330 to the second bond fingers 120 of the package substrate 100. The chip boding wires 460 may be connection members for electrically connecting the interface chip 300 to the package substrate 100.

As described above, because chip pads such as the chip pads 310, 320, and 330 are arrayed in a plurality of columns, sufficient spaces between the chip pads may be provided. Thus, it may be possible to prevent bonding wires connected to the chip pads from undesirably crossing or contacting each other.

Figure 7:
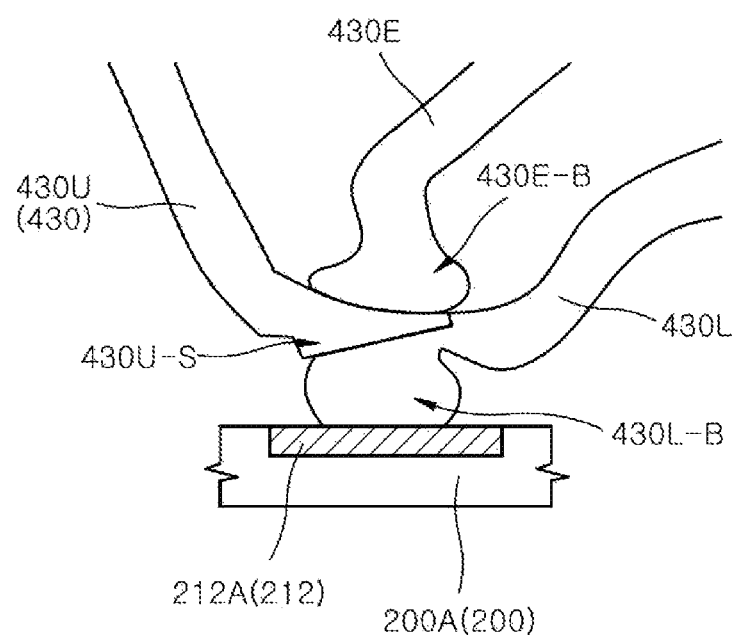
FIG. 7 is a cross-sectional view illustrating a bonded structure of wires at a branch position 'A' of FIG. 3.

FIG. 7 is a cross-sectional view illustrating a bonded structure of wires at a branch position 'A' of FIG. 3.

Referring to FIGS. 3 and 7, the first interpose wire 430 may be configured to include a first sub-wire 430L connected to a first interpose die pad 212A (corresponding to one of the first interpose die pads 212) of a semiconductor die 200A (corresponding to one of the semiconductor dies 200) located at the branch position 'A' and a second sub-wire 430U bonded to the first sub-wire 430L. First, a first ball portion 430L-B of the first sub-wire 430L may be bonded to the first interpose die pad 212A. After the first ball portion 430L-B is bonded to the first interpose die pad 212A, the first sub-wire 430L may extend to be connected to the other semiconductor die 200 located under the semiconductor die 200A.

The semiconductor die 200A located at the branch position 'A' may be a lowermost die of the semiconductor dies 200 included in the first sub-stack part 200U. On the lowermost semiconductor die 200A, the first and second signal extension wires 410E and 420E may extend from the first signal wire 410 and the second signal wire 420, respectively. The first shielding wire 430E may also be branched from the lowermost semiconductor die 200A. The first shielding wire 430E may be branched from the first interpose wire 430 on the lowermost semiconductor die 200A of the first sub-stack part 200U. Thus, the first shielding wire 430E may be located to be substantially parallel with the first and second signal extension wires 410E and 420E, thereby maximizing a shielding effect of the electromagnetic interference between the first and second signal extension wires 410E and 420E.

As such, after the first sub-wire 430L is formed using a first wire bonding process, the second sub-wire 430U may be bonded to the first ball portion 430L-B using a second wire bonding process. After bonding a ball portion (not shown) corresponding to an end portion of the second sub-wire 430U to the semiconductor die 200 disposed on the lowermost semiconductor die 200A and extending the second sub-wire 430U, a stitch portion 430U-S of the second sub-wire 430U may be bonded to the first ball portion 430L-B of the first sub-wire 430L to form the second sub-wire 430U. Thus, a vertical bonding structure may be realized to include the first ball portion 430L-B (of the first sub-wire 430L) and the stitch portion 430U-S (of the second sub-wire 430U) which are sequentially and vertically stacked.

A bonding wire may be formed by a wire boding process such that one end of the bonding wire has a ball-shaped ball portion and the other end of the bonding wire has a plate-shaped stitch portion. Because the first ball portion 430L-B of the first sub-wire 430L has a ball shape, it may be structurally more stable to vertically bond the stitch portion 430U-S (having a plate shape) of the second sub-wire 430U to the first ball portion 430L-B rather than to bond a ball portion (not shown) of the second sub-wire 430U to the first ball portion 430L-B.

A second ball portion 430E-B of the first shielding wire 430E may be bonded to the stitch portion 430U-S of the second sub-wire 430U using a third wire bonding process. Thus, the first ball portion 430L-B of the first sub-wire 430L, the stitch portion 430U-S of the second sub-wire 430U, and the second ball portion 430E-B of the first shielding wire 430E may be sequentially and vertically stacked on the first interpose die pad 212A to form a bonding wire branch structure.

Figure 8:
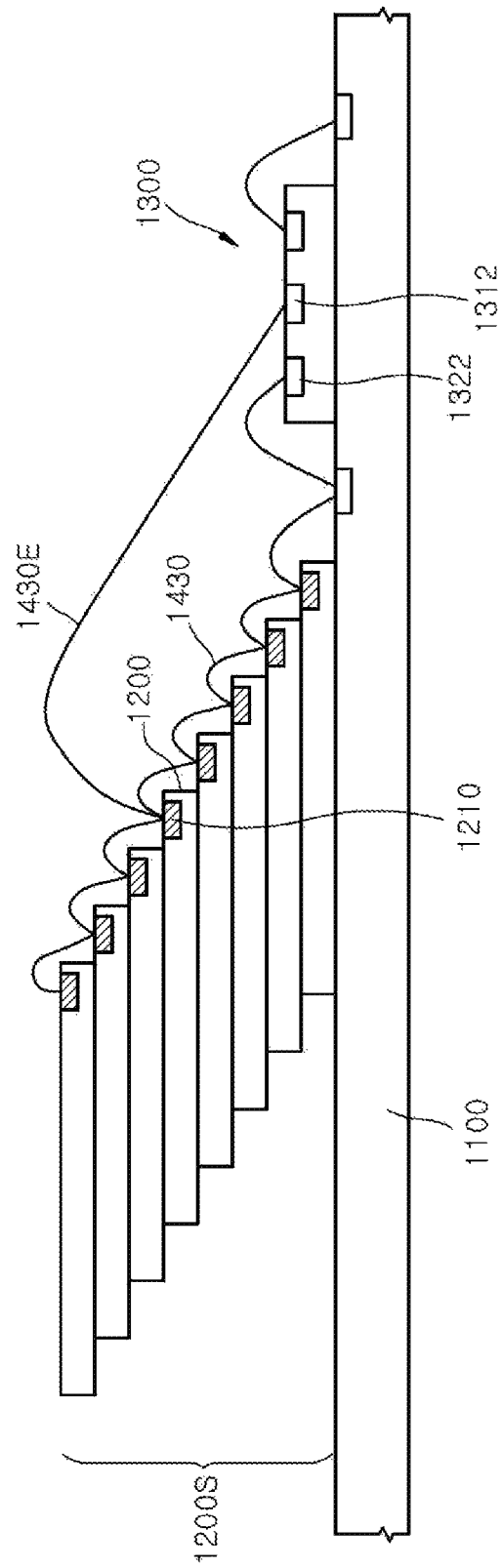
FIG. 8 is a cross-sectional view illustrating a semiconductor package according to another embodiment.

FIG. 8 is a cross-sectional view illustrating a semiconductor package 11 according to another embodiment.

Referring to FIG. 8, the semiconductor package 11 may be configured to include a package substrate 1100 and a die stack 1200S stacked on package substrate 1100. The die stack 1200S may be provided by sequentially stacking a plurality of semiconductor dies 1200. An interface chip 1300 may be disposed on the package substrate 1100 to be spaced apart from the die stack 1200S. A first bonding wire 1430 may be formed to connect die pads 1210 disposed on the plurality of semiconductor dies 1200 to each other and may extend to electrically connect the die pads 1210 to a first chip pad 1322 of the interface chip 1300. The first bonding wire 1430 may have substantially the same configuration as the first interpose wire 430 illustrated in FIG. 5. The first chip pad 1322 of the interface chip 1300 may indicate the first interpose chip pad 322 illustrated in FIG. 5.

A second bonding wire 1430E may be branched from the first bonding wire 1430 and may be connected to a second chip pad 1312 of the interface chip 1300. The second chip pad 1312 of the interface chip 1300 may indicate the first shielding chip pad 312 illustrated in FIG. 3. The first bonding wire 1430 may indicate the first interpose wire 430 illustrated in FIG. 5, and the second bonding wire 1430E may indicate the first shielding wire 430E illustrated in FIG. 5. Thus, a structure that the second bonding wire 1430E is branched from the first bonding wire 1430 may be the same as the wire bonding structure at the branch position 'A' illustrated in FIG. 5. The structure that the second bonding wire 1430E is branched from the first bonding wire 1430 may be formed by vertically bonding the stitch portion 430U-S of the second sub-wire 430U to the first ball portion 430L-B of the first sub-wire 430L and by vertically bonding the second ball portion 430E-B of the first shielding wire 430E to the stitch portion 430U-S of the second sub-wire 430U, as described with reference to FIG. 7.

Figure 9:
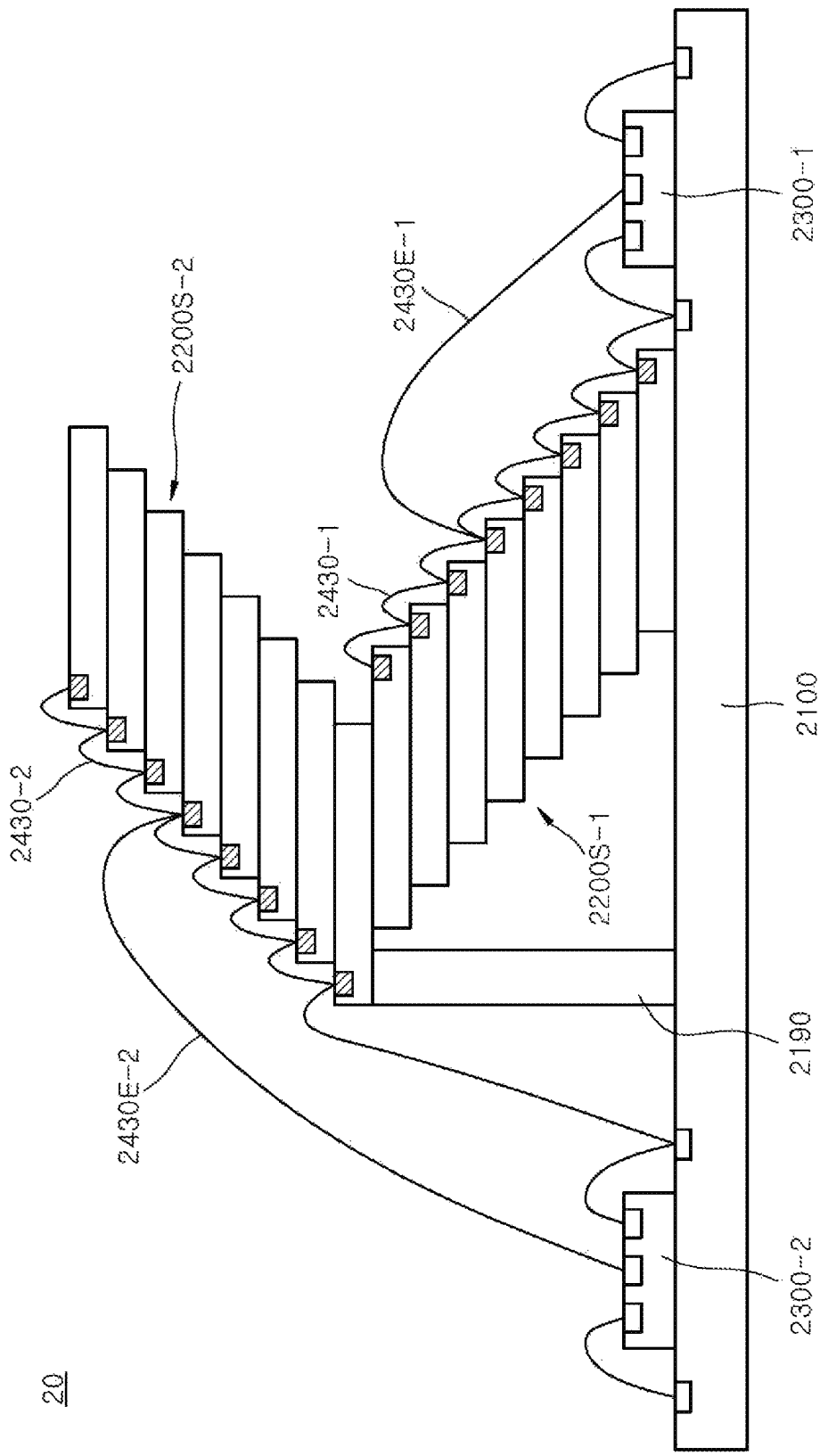
FIG. 9 is a cross-sectional view illustrating a semiconductor package according to yet another embodiment.

FIG. 9 is a cross-sectional view illustrating a semiconductor package 20 according to yet another embodiment.

Referring to FIG. 9, the semiconductor package 20 may be configured to include a package substrate 2100, a first die stack 2200S-1, a second die stack 2200S-2, a first interface chip 2300-1, and a second interface chip 2300-2. The first die stack 2200S-1 may have substantially the same configuration as the die stack 200S described with reference to FIGS. 1 to 5. The first interface chip 2300-1 may have substantially the same configuration as the interface chip 300 described with reference to FIGS. 1 to 5. The second die stack 2200S-2 may also have substantially the same configuration as the die stack 200S described with reference to FIGS. 1 to 5. The second interface chip 2300-2 may also have substantially the same configuration as the interface chip 300 described with reference to FIGS. 1 to 5.

The first die stack 2200S-1 may be connected to the first interface chip 2300-1 by bonding wires, and the second die stack 2200S-2 may be connected to the second interface chip 2300-2 by other bonding wires. The second die stack 2200S-2 may be stacked on the first die stack 2200S-1. A supporter 2190 may be provided between the package substrate 2100 and a portion of the second die stack 2200S-2 to support the second die stack 2200S-2.

A boding wire structure having substantially the same configuration as the boding wire structure illustrated in FIG. 3 may be provided to electrically connect the first die stack 2200S-1 to the first interface chip 2300-1. A first interpose wire 2430-1 may be provided to connect the first die stack 2200S-1 to the first interface chip 2300-1, and a first shielding wire 2430E-1 may be branched from the first interpose wire 2430-1 to be connected to the first interface chip 2300-1.

A boding wire structure having substantially the same configuration as the boding wire structure illustrated in FIG. 3 may be provided to electrically connect the second die stack 2200S-2 to the second interface chip 2300-2. A second interpose wire 2430-2 may be provided to connect the second die stack 2200S-2 to the second interface chip 2300-2, and a second shielding wire 2430E-2 may be branched from the second interpose wire 2430-2 to be connected to the second interface chip 2300-2.

The first and second interface chips 2300-1 and 2300-2 may independently communicate with the first and second die stacks 2200S-1 and 2200S-2 through the bonding wire structure described above. While the first die stack 2200S-1 communicates with the first interface chip 2300-1, the second die stack 2200S-2 may communicate with the second interface chip 2300-2. Accordingly, an operation speed of the semiconductor package 20 may be improved.

Figure 10:
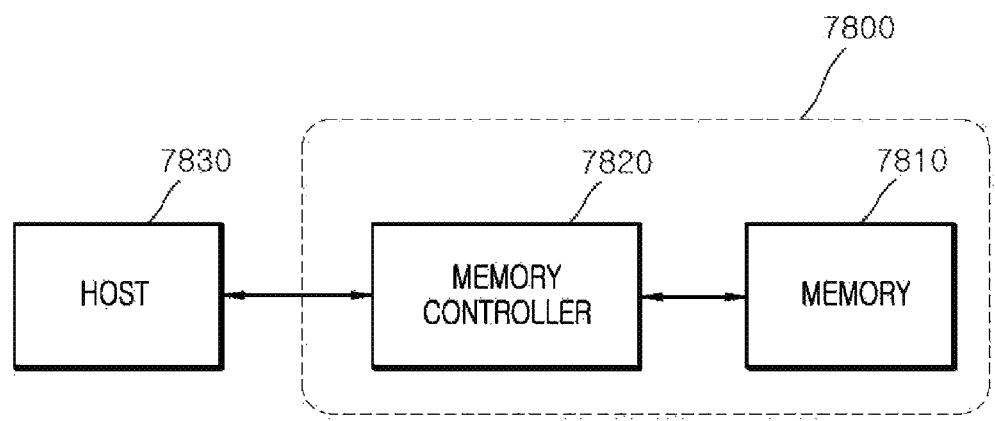
FIG. 10 is a block diagram illustrating an electronic system employing a memory card including at least one of semiconductor packages according to the embodiments.

FIG. 10 is a block diagram illustrating an electronic system including a memory card 7800 employing at least one of the semiconductor packages according to the embodiments. The memory card 7800 includes a memory 7810 such as a nonvolatile memory device, and a memory controller 7820. The memory 7810 and the memory controller 7820 may store data or read out the stored data. At least one of the memory 7810 and the memory controller 7820 may include at least one of the semiconductor packages according to the embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 11:
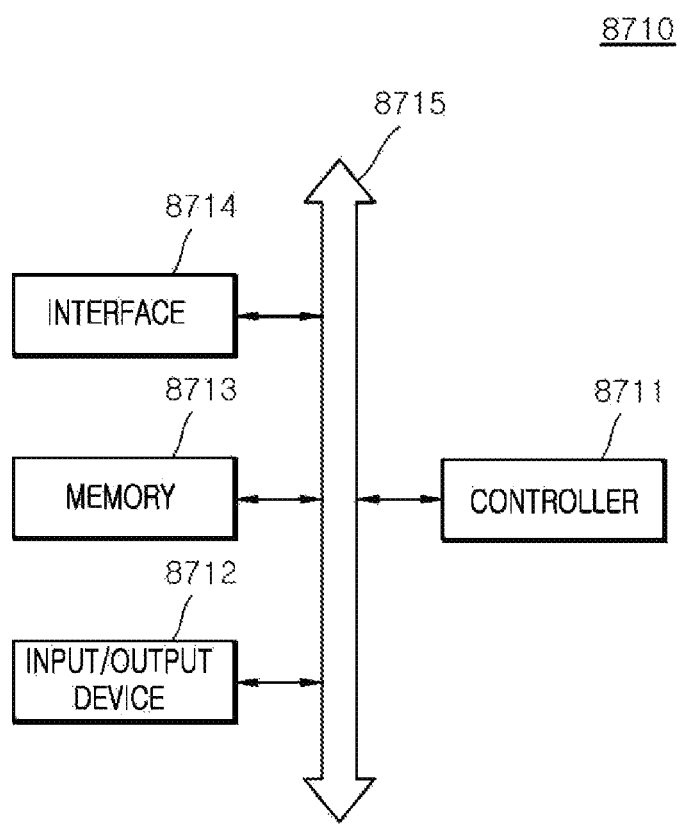
FIG. 11 is a block diagram illustrating another electronic system including at least one of semiconductor packages according to the embodiments.

FIG. 11 is a block diagram illustrating an electronic system 8710 including at least one of the stack packages according to the embodiments. The electronic system 8710 may include a controller 8711, an input/output unit 8712 and a memory 8713. The controller 8711, the input/output unit 8712 and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include at least one of the stack packages according to the embodiments of the present disclosure. The input/output unit 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution) or Wibro (wireless broadband Internet).

Concepts have been disclosed in conjunction with some embodiments as described above. Those skilled in the art will appreciate that various modifications, additions and substitutions are possible, without departing from the scope and spirit of the present disclosure. Accordingly, the embodiments disclosed in the present specification should be considered from not a restrictive standpoint but an illustrative standpoint. The scope of the concepts are not limited to the above descriptions but defined by the accompanying claims, and all of distinctive features in the equivalent scope should be construed as being included in the concepts.

What is claimed is:

1. A semiconductor package comprising:
    a package substrate;
    a die stack configured to include a first sub-stack part stacked on the package substrate and a second sub-stack part disposed between the first sub-stack part and the package substrate, wherein each of the first and second sub-stack parts includes a plurality of semiconductor dies and each of the plurality of semiconductor dies includes a first signal die pad, an interpose die pad, and a second signal die pad;
    an interface chip disposed on the package substrate to be spaced apart from the die stack;
    a first signal wire connecting the first signal die pads included in the first sub-stack part to each other;
    a first signal extension wire extending from the first signal wire to connect the first signal wire to the interface chip;
    a second signal wire connecting the second signal die pads included in the first sub-stack part to each other;
    a second signal extension wire extending from the second signal wire to connect the second signal wire to the interface chip;
    an interpose wire connecting the interpose die pads included in the first and second sub-stack parts to each other and electrically connecting the interpose die pads included in the first and second sub-stack parts to the interface chip; and
    a shielding wire branched from the interpose wire to be located between the first and second signal extension wires.

2. The semiconductor package of claim 1, wherein the shielding wire is branched from the interpose wire and extends to be substantially parallel with the first and second signal extension wires.

3. The semiconductor package of claim 2, wherein the shielding wire is configured to shield an electromagnetic interference between the first and second signal extension wires by extending to be substantially parallel with the first and second signal extension wires.

4. The semiconductor package of claim 1,
    wherein the first and second signal extension wires are configured to transmit data signals, and
    wherein the shielding wire is configured to supply one of a ground voltage and a power supply voltage.

5. The semiconductor package of claim 1, wherein the shielding wire is configured to extend in a direction between the first and second signal extension wires and along a same profile as at least one of the first and second signal extension wires.

6. The semiconductor package of claim 1, further comprising:
    a third signal wire connecting the first signal die pads included in the second sub-stack part to each other and extending to electrically connect the first signal die pads included in the second sub-stack part to the interface chip; and
    a fourth signal wire connecting the second signal die pads included in the second sub-stack part to each other and extending to electrically connect the second signal die pads included in the second sub-stack part to the interface chip.

7. The semiconductor package of claim 6,
    wherein the package substrate includes signal bond fingers disposed between the die stack and the interface chip; and
    wherein the third and fourth signal wires are bonded to respective ones of the signal bond fingers and are configured to further extend to connect the signal bond fingers to the interface chip.

8. The semiconductor package of claim 7,
wherein the package substrate further includes an interpose bond finger disposed between the die stack and the interface chip to be spaced apart from the signal bond fingers; and
wherein the interpose wire is bonded to the interpose bond finger and is configured to further extend to connect the interpose bond finger to the interface chip.

9. The semiconductor package of claim 1, wherein the shielding wire is branched from the interpose wire on a lowermost semiconductor die of the semiconductor dies included in the first sub-stack part.

10. The semiconductor package of claim 1, wherein the interpose wire includes:
a first sub-wire, a first ball portion of the first sub-wire is bonded to the interpose die pad located at a position where the shielding wire is branched from the interpose wire; and
a second sub-wire, a stitch portion of which is vertically bonded onto the first ball portion,
wherein the shielding wire includes a second ball portion vertically bonded onto the stitch portion.

11. The semiconductor package of claim 1, wherein the first and second signal extension wires and the shielding wire extend to be spaced apart from the package substrate and to be connected to the interface chip.

12. The semiconductor package of claim 1, wherein the interpose die pads are provided as power terminals for applying a power supply voltage to the semiconductor dies.

13. The semiconductor package of claim 1, wherein the interpose die pads are provided as ground terminals for supplying a ground voltage to the semiconductor dies.

14. The semiconductor package of claim 1, wherein in each of the semiconductor dies, the interpose die pad is disposed between the first signal die pad and the second signal die pad.

15. The semiconductor package of claim 1, wherein the interface chip includes chip pads to which the first and second signal extension wires, the interpose wire, and the shielding wire are bonded.

16. A semiconductor package comprising:
a package substrate;
a die stack configured to include a first sub-stack part stacked on the package substrate and a second sub-stack part disposed between the first sub-stack part and the package substrate, wherein each of the first and second sub-stack parts includes a plurality of semiconductor dies and each of the plurality of semiconductor dies includes a first signal die pad, an interpose die pad, and a second signal die pad;
an interface chip disposed on the package substrate to be spaced apart from the die stack and configured to include a first column of chip pads and a second column of chip pads, wherein the first column of chip pads include a first signal chip pad, a shielding chip pad, and a second signal chip pad, and the second column of chip pads include a third signal chip pad, an interpose chip pad, and a fourth signal chip pad;
a first signal wire connecting the first signal die pads included in the first sub-stack part to each other;
a first signal extension wire extending from the first signal wire to connect the first signal wire to the first signal chip pad;
a second signal wire connecting the second signal die pads included in the first sub-stack part to each other;
a second signal extension wire extending from the second signal wire to connect the second signal wire to the second signal chip pad;
an interpose wire connecting the interpose die pads included in the first and second sub-stack parts to each other and electrically connecting the interpose die pads included in the first and second sub-stack parts to the interpose chip pad;
a third signal wire connecting the first signal die pads included in the second sub-stack part to each other and extending to electrically connect the first signal die pads included in the second sub-stack part to the third signal chip pad;
a fourth signal wire connecting the second signal die pads included in the second sub-stack part to each other and extending to electrically connect the second signal die pads included in the second sub-stack part to the fourth signal chip pad; and
a shielding wire branched from the interpose wire to be located between the first and second signal extension wires.

17. The semiconductor package of claim 16,
wherein the interface chip includes a first edge and a second edge which are opposite to each other;
wherein a distance between the first edge and the die stack is less than a distance between the second edge and the die stack;
wherein a distance between the first edge and the second column of chip pads is less than a distance between the first edge and the first column of chip pads; and
wherein the second column of chip pads are arrayed in a direction substantially parallel with the first edge.

18. The semiconductor package of claim 17,
wherein the interface chip further includes a third column of chip pads arrayed between the second edge and the first column of chip pads; and
wherein the third column of chip pads are electrically connected to the package substrate through chip bonding wires.

19. The semiconductor package of claim 16, wherein the package substrate includes signal bond fingers disposed between the die stack and the interface chip; and
wherein the third and fourth signal wires are bonded to respective ones of the signal bond fingers and are configured to further extend to connect the signal bond fingers to the interface chip.

20. The semiconductor package of claim 19,
wherein the package substrate further includes an interpose bond finger disposed between the die stack and the interface chip to be spaced apart from the signal bond fingers; and
wherein the interpose wire is bonded to the interpose bond finger and is configured to further extend to connect the interpose bond finger to the interface chip.

21. The semiconductor package of claim 16, wherein the first and second signal extension wires and the shielding wire extend to be spaced apart from the package substrate and to be connected to the interface chip.

* * * * *